United States Patent [19]

Fukao et al.

[11] 4,117,397
[45] Sep. 26, 1978

[54] NON-DESTRUCTIVE INSULATION TEST APPARATUS

[75] Inventors: Isao Fukao, Kodaira; Kimio Monma, Chigasaki, both of Japan

[73] Assignee: Nihon Seimitsu Keisoku, Osaka, Japan

[21] Appl. No.: 739,137

[22] Filed: Nov. 5, 1976

[30] Foreign Application Priority Data

Feb. 20, 1976 [JP] Japan .................................. 51/17021

[51] Int. Cl.² .......................................... G01R 31/14
[52] U.S. Cl. ..................................................... 324/54
[58] Field of Search ........................................... 324/54

[56] References Cited
U.S. PATENT DOCUMENTS

| | | | |
|---|---|---|---|
| 2,837,714 | 6/1958 | Hill .................................. | 324/54 |
| 2,920,270 | 1/1960 | Saw ................................. | 324/54 |
| 3,259,893 | 7/1966 | Parker ............................. | 324/54 X |
| 3,491,290 | 1/1970 | Peschel ........................... | 324/54 |
| 3,510,763 | 5/1970 | Clinton ........................... | 324/54 |
| 3,548,302 | 12/1970 | Arnold et al. .................. | 324/54 |
| 3,789,294 | 1/1974 | Nitta et al. ..................... | 324/54 |
| 3,823,370 | 7/1974 | Pendleton et al. ............. | 324/54 |
| 3,986,107 | 10/1976 | Dickson et al. ................ | 324/54 |

*Primary Examiner*—Gerard R. Strecker
*Attorney, Agent, or Firm*—Oblon, Fisher, Spivak, McClelland & Maier

[57] ABSTRACT

A non-destructive insulation test method and apparatus therefor, wherein in non-destructively testing the behavior of insulation by applying a high d.c. voltage to a test piece, stepped test voltages are applied to the test piece while observing partial discharges occurring within the test piece and monitoring a safe state. At the voltage application of each step, the applied voltage is controlled so that the current may maintain a fixed value until sufficient charge is fed to the test piece. The applied voltage is raised to a predetermined value in this manner so that the internal impedance of the test apparatus at charging can be regarded as substantially zero, whereby the rate of rise of the applied voltage to the predetermined value is hastened.

2 Claims, 4 Drawing Figures

NON-DESTRUCTIVE INSULATION TEST APPARATUS

BACKGROUND OF THE INVENTION

1. Field of the Invention

This invention relates to a method and apparatus for non-destructively testing the state of insulation or the performance of a variety of electrical machines and equipment by applying a high d.c. voltage.

2. Description of the Prior Art

In order to inspect the insulation state of an electric installation such as power cable, various non-destructive test methods have been developed and performed. The high d.c. voltage method which is one of the non-destructive test methods tests the behavior of the insulation, especially the state of deterioration due to the dry or moist condition or to voids or cracks in an insulator, from the current - time characteristic, the insulation resistance - voltage characteristic, etc.

When a d.c. voltage is applied to an insulator, three components of current flow — a displacement current (Id) (charging current), an absorption current (Ia) and a leakage current (Ir). The displacement current is a current which charges the capacitance of the insulator when the voltage is applied, and it decays instantly. The absorption current is a current which is caused by the polarization of the insulator, and it decays gradually with time. The leakage current is a conduction current which flows through the interior or surface of the insulator, and it is substantially constant versus time.

The resultant current of the three components is measured as the total current. Since the current value itself varies in dependence on the size, configuration etc. of a specimen, it is difficult to judge the behavior of the insulation simply from the magnitude of the current. When the specimen moistens or deteriorates, the leakage current becomes very large. Therefore, that proportion of the total current which is constituted by the leakage current (which is constant versus time) increases, and the rate of decay of the current decreases. Exploiting this fact, the current - time characteristic employs the time variation of the current as the criterion of the moist or dry state. The polarization index (P.I.) which is defined by Eq. (1) or (2) is used as an indicator.

In terms of the leakage current value, $$P.I. = \frac{\text{Current at 1 min. after application of voltage}}{\text{Current at } n \text{ min. after application of voltage}} \quad (1)$$

In terms of the insulation resistance value, $$P.I. = \frac{\text{Insulation resistance value at } n \text{ min. after application of voltage}}{\text{Insulation resistance value at 1 min. after application of voltage}} \quad (2)$$

The time "$n$ min." differs in dependence on the configuration, material etc. of the specimen to be tested, and is determined to be "3 min.," "5 min.," "7 min.," "10 min.," etc. When the currents (or insulation resistances) after 1 min. and $n$ min. are measured, the applied voltage must have been raised to a prescribed voltage for the test. It is accordingly necessary to complete the charging of the test piece and raise the applied voltage to the prescribed value within at the latest 1 min.

In prior-art test apparatus for evaluating the current - time characteristic, however, as illustrated in FIG. 1, the internal resistance R of the test apparatus is made large to protect the test apparatus from the surge of charging current to the capacitance Ca of the test piece Rx (whose equivalent circuit is shown in the figure) at the initiation of the application of the voltage. Therefore, the applied voltage Vo is gradually raised with a time constant which is determined by the internal resistance R and the capacitance Ca. The current Io fluctuates greatly in dependence on the specifications of the test piece. Moreover, it is impossible to raise the applied voltage to the prescribed value at 1 min. after the application of the voltage. Consequently, it is quite impossible to determine a reliable value for the polarization index.

SUMMARY OF THE INVENTION

It is therefore an object of this invention to eliminate the disadvantages of the prior art and to enable one to evaluate the true value of the polarization index.

In a low electric field, the leakage current of an insulator follows Ohm's law, and the insulation resistance is independent of the voltage. In a high electric field, however, the leakage current deviates from Ohm's law. Where the insulation state is good (the insulator is dry), the insulation resistance increases in direct proportion to the voltage and continues to increase up to a certain voltage. However, at voltages beyond a certain value, the insulation resistance varies inversely with the voltage (i.e. it decreases). The voltage at which the maximum insulation resistance value occurs has a considerably high value. Thus, the insulation resistance - voltage characteristic curve is convex in shape. Where the insulator moistens and deteriorates, the voltage value which gives the maximum insulation resistance value becomes considerably low, and the characteristic curve becomes flat. In the past, the insulation state has been determined from such insulation resistance - voltage characteristic, i.e., the extent of the variation of the insulation resistance versus the voltage. As an index for representing the quality of the insulation state, one given by Eq. (3) is employed.

$$\frac{\text{Insulation resistance at 50 \%-voltage of prescribed voltage}}{\text{Insulation resistance at 100 \%-voltage of prescribed voltage}} \quad (3)$$

In this regard, another object of the invention is to facilitate the measurement of insulation resistances at various applied voltages and to achieve the enhancement of the test efficiency.

In the high d.c. voltage method in which the current - time characteristic and the insulation resistance - voltage characteristic stated above are obtained, the voltage must be applied up to a comparatively high voltage. At this time, there is the danger that the dielectric breakdown will be induced. As to an actual insulator, however, it is difficult to predict the breakdown voltage on account of the complicated structure of the insulator and the moistening, stains, defects etc. thereof.

Therefore, still another object of this invention is to prevent the test piece from leading to the breakdown. To this end, in the present invention, partial discharge which occurs within the insulator specimen is measured so as to quickly detect the dangerous state. The partial discharge is generated by the presence of voids within the insulator specimen, and it is also possible to know the deteriorated state of the insulating material from the intensity and frequency of the partial discharge.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 2:
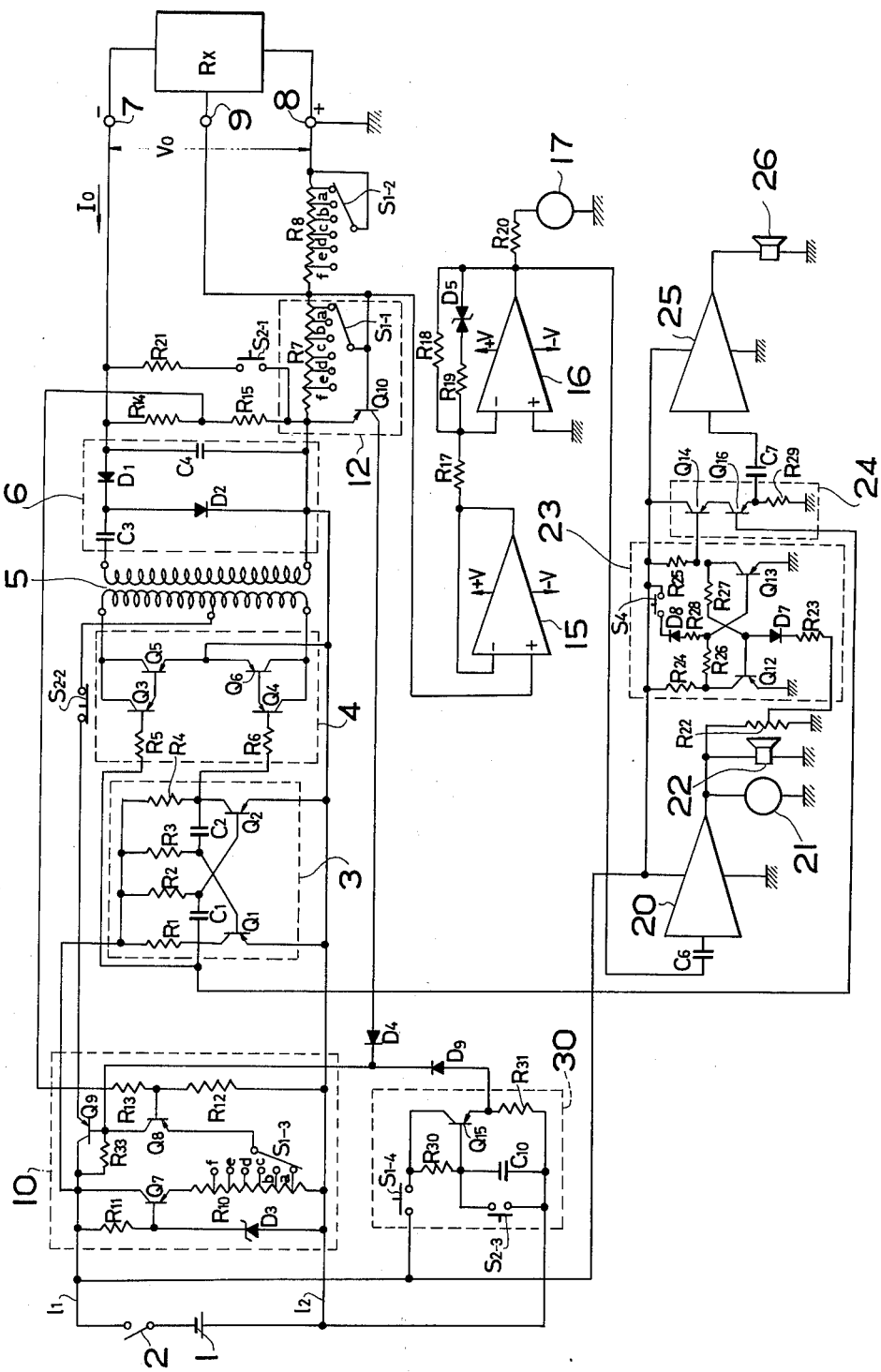
FIG. 2 is a circuit diagram showing an example of non-destructive insulation test apparatus to which this invention is applied.

Referring now to the drawings, wherein like reference numerals designate identical or corresponding parts throughout the several views, and more particularly to FIG. 2 thereof, numeral 1 designates a battery, and numeral 2 a power switch. Shown at 3 is an oscillator which in this embodiment is a multivibrator consisting of transistors $Q_1$, $Q_2$, capacitors $C_1$, $C_2$ and resistances $R_1$, $R_2$, $R_3$, $R_4$. The oscillator 3 need not be restricted to the illustrated construction and can be formed from other varieties of oscillators. Numeral 4 denotes a d.c. - a.c. converter which receives the output of the oscillator 3 and whose output is connected to the primary side of a step-up transformer 5. The secondary side of the step-up transformer 5 is connected to a rectifier 6.

The rectifier 6 is a voltage doubler which consists of semiconductor rectifier elements $D_1$, $D_2$ and capacitors $C_3$ and $C_4$. It can also take the form of a multistage rectifier. A high d.c. voltage is generated at the output of the rectifier 6. The minus side output of the rectifier circuit 6 is connected to a measuring terminal 7, while the plus side output is connected to the other measuring terminal 8 through resistances $R_7$, $R_8$ and change-over switches $S_{1-1}$, $S_{1-2}$ which effect special uses to be described later. The measuring terminal 8 is grounded.

Shown at 10 is a voltage stabilizer, which consists of a differential amplifier having transistors $Q_7$ and $Q_8$. The collector of transistor $Q_7$ is connected to the negative terminal lead $l_1$ of the battery 1, and the emitter is connected to the positive terminal lead $l_2$ of the battery 1 through a resistance $R_{10}$. A constant-voltage diode $D_3$ and a resistance $R_{11}$ are arranged in series across both the poles of the battery 1. The junction between the components $D_3$ and $R_{11}$ is connected with the base of the transistor $Q_7$. The emitter of the transistor $Q_8$ is connected to the lead $l_2$ through a change-over switch $S_{1-3}$ to be described later and the resistance $R_{10}$, and the collector is connected to the base of a voltage controlling transistor $Q_9$. The collector of the transistor $Q_9$ is connected to the lead $l_1$, and the emitter to the primary side of the step-up transformer 5. By controlling the collector - emitter voltage of the transistor $Q_9$, an output voltage $V_o$ can be controlled. The base of the transistor $Q_8$ is connected through a resistance $R_{12}$ to the lead $l_2$, and is further connected through a resistance $R_{13}$ to divider resistances $R_{14}$, $R_{15}$ which are arranged at the output of the rectifier circuit 6.

Numeral 12 indicates a current limiter, which consists of a transistor $Q_{10}$, the resistance $R_7$ and the change-over switch $S_{1-1}$. The emitter of the transistor $Q_{10}$ is connected to the lead $l_2$ (the plus side output of the rectifier circuit 6), and the collector is connected to the base of the voltage controlling transistor $Q_9$ (through a diode $D_4$). Across the base and emitter of the transistor $Q_{10}$, the resistance $R_7$ is connected through the switch $S_{1-1}$. The base of the transistor $Q_{10}$ is connected to the measuring terminal 8 through the resistance $R_8$. The current limiter 12 has the function of limiting an output current $I_o$ to below a predetermined value. The value of the resistance $R_7$ is determined so that, when the output current value has reached the predetermined value, an emitter - base voltage (i.e., a voltage drop value across the resistance $R_7$) which puts the transistor $Q_{10}$ into a substantially saturated state may be generated. Accordingly, when the output current $I_o$ has reached the predetermined value, the transistor $Q_{10}$ falls into the saturated state, to move the operating point of the voltage controlling transistor $Q_9$ and to control the output voltage $V_o$ in the direction of keeping it low. In this manner, in order to limit the output current value to below the predetermined value, a high output resistance is not employed as in the prior art but the output voltage $V_o$ is controlled. When the output current $I_o$ falls below the predetermined value, the base - emitter voltage of the transistor $Q_{10}$ drops and hence the emitter - collector voltage rises, with the result that the output voltage $V_o$ rises under the action of the transistor $Q_9$. This signifies that the applied voltage $V_o$ is controlled so that the current $I_o$ to be supplied to an object-to-be-measured Rx (or a load) connected between the measuring terminals 7 and 8 cannot exceed the predetermined value. The output voltage - current characteristic will be described in detail later.

In this embodiment, rated output voltages can be obtained in several stages, for example, in six stages of 1000 V, 2000 V, 3000 V, 4000 V, 5000 V and 6000 V. The change-over switches $S_{1-1}$, $S_{1-2}$ and $S_{1-3}$ are switches for changing-over the rated output voltages, and they are operated in interlocking fashion. A terminal $a$ in each of the change-over switches is a terminal for 1000 V, and a terminal $f$ is a terminal for 6000 V. The resistance $R_7 (= r_1 + r_2 + r_3 + r_4 + r_5 + r_6)$ disposed between the terminals $a$ and $f$ of the change-over switch $S_{1-1}$ within the foregoing current limiter circuit 12 has the respective resistance values determined so that the current limit value may be constant, for example, 0.2 mA at the rated output of 1000 V, 0.4 mA at 2000 V, 0.6 mA at 3000 V, 0.8 mA at 4000 V, 1 mA at 5000 V and 1.2 mA at 6000 V. The rated output voltages and the respective current limit values can be subject to design modifications as desired.

Numerals 15 and 16 designate amplifiers, and numeral 17 designates an insulation resistance indicator. The insulation resistance value is measured by detecting the voltage drop across resistance $R_8$. The amplifier 15 has a high input impedance. The gain of the amplifier 16 is determined by the ratio between resistances $R_{17}$ and $R_{18}$ in a low voltage region, and by the ratio between resistances $R_{17}$ and $R_{19}$ in a high voltage region. $D_5$ represents a constant-voltage diode. The values of the resistances $R_{18}$ and $R_{19}$ have the relation $R_{18} >> R_{19}$. The intervals of a high region portion of graduations of the insulation resistance indicator 17 are magnified by the resistances $R_{18}$, $R_{19}$ and the constant-voltage diode $D_5$, so that the reading of the graduations is made accurate and easy over the entire region from the low region to the high region of the insulation resistance values. The resistance $R_8$ acts as a shunt. Its resistance value can be varied by changing-over the change-over switch $S_{1-2}$. Even in the case where the rated output voltage between the measuring terminals 7 and 8 is successively changed-over to 1000 V–6000 V, the graduations of the insulation resistance indicator 17 can be held to a single scale.

Figure 4:
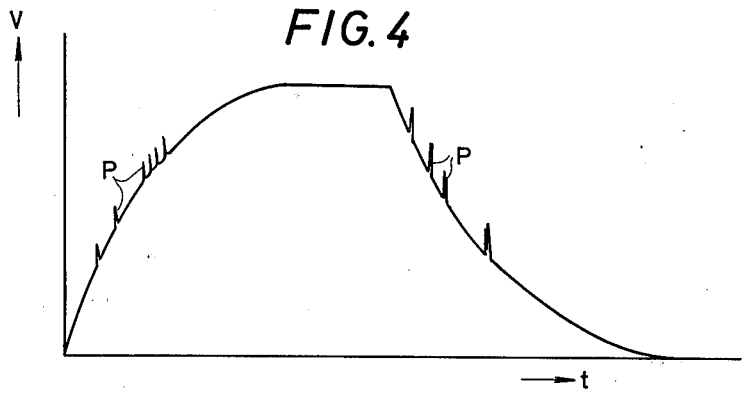
FIG. 4 is a diagram of the partial discharge characteristic.

The partial discharge occurs at the rise or fall of the applied voltage $V_o$. As shown in FIG. 4, the partial discharges are observed as pulses P at the rising and falling parts of an applied voltage characteristic curve. In the circuit shown in FIG. 2, a partial discharge pulse signal appears at the output of the amplifier 16. It is coupled into an amplifier 20 through a capacitor $C_6$ to remove any d.c. component. A pulse meter 21 and an earphone 22 are disposed on the output side of the amplifier 20, so that occurrence of the partial discharges can be visually and auditorily monitored.

Shown at $R_{22}$ is a resistance for setting a level. When the level of the partial discharge pulse reaches a certain value, a flip-flop 23 is set, the output signal of the oscillator 3 is coupled into an amplifier 25 via a gate circuit 24, and a continuous sound is given forth from an earphone 26. The continuous sound from the earphone 26 is an alarm signal which indicates that the partial discharge situation comes close to the dangerous state. By immediately stopping the insulation test when the alarm signal is issued, the test piece can be prevented from reaching the breakdown point. It is preferable that the earphones 22 and 26 be constructed of a stereo headphone so as to hear the two kinds of signals with both the right and left ears. Naturally it is possible to substitute a speaker for the earphone 22 and a buzzer, a lamp or the like for the earphone 26.

In order to reliably determine the occurrence of the partial discharges, the rising gradient of the applied voltage $V_o$ need be made somewhat gentle.

Figure 1:
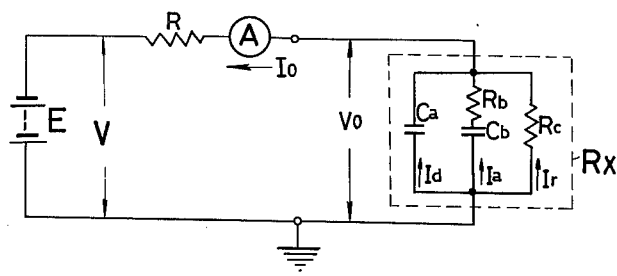
FIG. 1 is a circuit diagram of the prior-art test apparatus.
Figure 3:
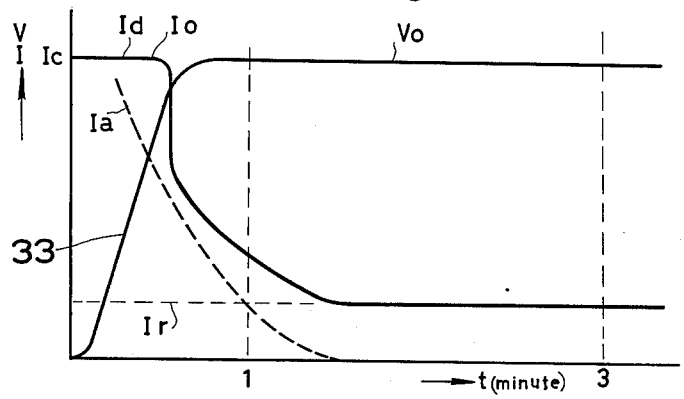
FIG. 3 is a diagram of the current - time characteristic and the voltage - time characteristic.

Numeral 30 designates a voltage rise controlling circuit. It consists of a transistor $Q_{15}$, resistances $R_{30}$, $R_{31}$ and a capacitor $C_{10}$. The emitter of the transistor $Q_{15}$ is connected to the base of the voltage adjusting transistor $Q_9$ (through a diode $D_9$). A switch $S_3$ operates in synchronism with a change-over switch $S_1$, and a switch $S_{2-3}$ operates in interlocking fashion with switches $S_{2-1}$ and $S_{2-2}$. The transistor $Q_{15}$ operates in response to the charging characteristic of the capacitor $C_{10}$, controls the operating point of the transistor $Q_9$ and renders the applied voltage characteristic curve a substantially lump waveform. The applied voltage characteristic curve in FIG. 3 is shown for the time when the voltage rise controlling circuit 30 is operated. The gradient of a sloping part 33 becomes easier as the charging characteristic of the capacitor $C_{10}$ is gentler. Where the circuit 30 is not operated, the gradient becomes more abrupt. Important here is that, even when the rising curve of the applied voltage $V_o$ is made gentle in order to measure the partial discharge, the extent must be such that the applied voltage can be raised to the rated voltage at 1 min. after the initiation of the application. This is possible in design, and the optimum state is experimentally decided.

Now, procedures for evaluating the polarization index and the weak point ratio will be explained. It is needless to say that, at this time, the test is conducted while continually monitoring the situation of occurrence of the partial discharges and confirming the safety.

First, the power switch 2 is closed. Subsequently, the applied voltage (rated output voltage)-setting switch $S_1$ ($S_{1-1}$, $S_{1-2}$, $S_{1-3}$) is set at 1000 V. Then, the output voltage $V_o$ begins to rise. The charging current flowing into the capacitance $C_o$ of the test piece $R_x$ at this time is limited to the predetermined value $I_c$ (for example, 0.2 mA) by the action of the current limiter 12. Thereafter, until the charging of the capacitance $C_o$ is substantially completed, the output voltage $V_o$ is increased so that the output current $I_o$ may become constant at the predetermined value $I_c$ by the actions of the current limiter 12 and the transistor $Q_9$. Accordingly, the test apparatus has the capability of supplying a fixed current to the capacitance $C_o$ of the test piece $R_x$ until the completion of the charging thereof. During the charging, the internal impedance of the test apparatus can be regarded as being substantially zero, so that the charging time can be made extremely short. At the completion of the charging, the output voltage $V_o$ has been raised substantially to the rated value (1000 V). In this way, the voltage applied to the test piece $R_x$ (output voltage $V_o$) is allowed to rise up to the rated value reliably within 1 min.

When the supply of sufficient charge to the capacitance $C_o$ is completed, the output current $I_o$ decreases suddenly, and its value becomes the sum of the absorption current and the leakage current. At 1 min. and 3 min. (or 5 min., 7 min., 10 min., etc. which are determined by the specification of the test piece) after the application, the applied voltage is constant at the rated voltage. The insulation resistance values at the respective times are read with the indicator 17, and are substituted into Eq. (2) to evaluate the polarization index. As previously stated, the charging terminates within 1 min. after the application, and the output current consists only of the absorption current and the leakage current after 1 min., so that a polarization ratio of extraordinarily high reliability can be evaluated.

When the measurement is completed, the discharging switch $S_{2-1}$ is closed to discharge the charge in the test piece $R_x$. At this time, the primary side of the step-up transformer 5 is opened by the switch $S_{2-2}$ interlocking with the switch $S_{2-1}$.

Subsequently, the change-over switch $S_1$ is changed-over to the 2000 V terminal, and the test is repeated similarly to the above. In this manner, the applied voltage is increased in the form of steps, and the high d.c. voltage tests are performed.

A terminal 9 is a guard terminal.

The quality of the insulation state can be tested in such a way that the applied voltage is varied by changing-over the change-over switches and the insulation resistance values at 100% and 50% of the prescribed voltage are evaluated and substituted into Eq. (3).

In this manner, the tests based on the high d.c. voltage method and the partial discharge detecting method are jointly carried out, whereby various insulation tests become possible without causing the insulator to break down.

As set forth above, according to this invention, the voltage applied to the test piece can be raised reliably to the rated value within 1 min., so that a highly reliable polarization index can be evaluated. Even in the case where test pieces of different specifications are to be tested, the applied voltage characteristic is rarely subjected to great influences by the capacities of the test pieces, so that the range of test objects can be made extensive and that test apparatus of a wide range of application can be realized.

It will be readily appreciated that the megger test can be conducted by directly reading the insulation resistance indicator 17.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for non-destructively testing the insulation of a test piece, the insulation characterized by an internal capacitance and comprising:
   a DC voltage source;
   a voltage controller connected to the voltage source;
   an oscillator connected to the voltage controller;
   a step-up transformer having a primary side connected to the output of the oscillator, and a secondary side;
   a rectifier having an input connected to the secondary side of the transformer and an output adapted to be connected to the test piece for applying a rising d.c. voltage across the insulation of the test piece to cause a charging current to flow into the internal capacitance of the insulation of the test piece;
   current limiter means connected to the rectifier and to the voltage controller for continuously operating the voltage controller to initially limit the charging current to a predetermined safe value in response to the instantaneous value of charging current and thereafter maintain the charging current constant and equal to the predetermined value until the d.c. voltage applied across the test piece has been raised to a rated output voltage;
   insulation resistance indicating means connected to the current limiter for evaluating the insulation resistance of the test piece from the output current values after the d.c. voltage applied across the test piece has been raised to the rated output voltage and to indicate the insulation resistance value for determining a polarization index for the insulation; and
   change-over switch means for changing over and setting the rated output voltage across the test piece in a stepped manner;
   whereby the charging of the test piece and the raising of the applied voltage to the rated output voltage can be completed rapidly and a reliable value can be determined for the polarization index.

2. An apparatus as recited in claim 1 further comprising:
   variable gain amplifier means for receiving a discharge pulse signal arising due to a partial discharge within said test piece,
   means for automatically varying the gain of said amplifier in accordance with the amplitude of said discharge pulse; and
   graduated indication means for auditorily and visually indicating the generation of said partial discharge,
   wherein the relative magnitude of the graduations of said indication means is determined by said variable gain amplifier means.

* * * * *